United States Patent
Carey et al.

(10) Patent No.: US 8,648,589 B2
(45) Date of Patent: Feb. 11, 2014

(54) MAGNETORESISTIVE SENSOR EMPLOYING NITROGENATED CU/AG UNDER-LAYERS WITH (100) TEXTURED GROWTH AS TEMPLATES FOR COFE, COFEX, AND CO₂(MNFE)X ALLOYS

(75) Inventors: Matthew J. Carey, San Jose, CA (US); Shekar B. Chandrashekariaih, San Jose, CA (US); Jeffrey R. Childress, San Jose, CA (US); Stefan Maat, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 683 days.

(21) Appl. No.: 12/581,045

(22) Filed: Oct. 16, 2009

(65) Prior Publication Data
US 2011/0089940 A1    Apr. 21, 2011

(51) Int. Cl.
*G01P 3/66*    (2006.01)
(52) U.S. Cl.
USPC .......................................... 324/179; 324/173
(58) Field of Classification Search
USPC ........................................................ 324/166
See application file for complete search history.

(56) References Cited

U.S. PATENT DOCUMENTS

| | | | |
|---|---|---|---|
| 5,287,238 A * | 2/1994 | Baumgart et al. | 360/314 |
| 5,408,377 A * | 4/1995 | Gurney et al. | 360/325 |
| 5,949,622 A * | 9/1999 | Kamiguchi et al. | 360/324.12 |
| 6,178,072 B1 * | 1/2001 | Gill | 360/324.11 |
| 6,338,899 B1 * | 1/2002 | Fukuzawa et al. | 360/324.12 |
| 6,580,589 B1 * | 6/2003 | Gill | 360/324.11 |
| 6,887,565 B2 | 5/2005 | Kanbe et al. | 428/336 |
| 7,336,453 B2 | 2/2008 | Hasegawa et al. | 360/324.12 |
| 7,416,794 B2 | 8/2008 | Maeda et al. | 428/832 |
| 7,446,987 B2 * | 11/2008 | Zhang et al. | 360/324.12 |
| 7,522,388 B2 | 4/2009 | Miyazawa et al. | 360/324 |

(Continued)

FOREIGN PATENT DOCUMENTS

| | | | | |
|---|---|---|---|---|
| JP | 7263773 | 10/1995 | | G01R 33/09 |
| JP | 9320033 | 12/1997 | | G11B 5/66 |
| JP | 11112053 | 4/1999 | | G11B 5/39 |
| JP | 2008218641 | 9/2008 | | H01L 43/08 |

OTHER PUBLICATIONS

McGraw-Hill, Crystal Structure and Crystal Geometry, Higher Education series, no date, Chap. 3, p. 67-115, http://highered.mcgraw-hill.com/sites/dl/free/0072402334/89597/sample_ch03.pdf.*

(Continued)

*Primary Examiner* — Thomas F Valone
(74) *Attorney, Agent, or Firm* — Zilka-Kotab, PC

(57) ABSTRACT

A magnetoresistive sensor that has a free layer with a face centered cubic, 100 crystal orientation formed on an under-layer structure that has been deposited in the presence of nitrogen. The free layer can be constructed of CoFe, $Co_2(Mn_{(1-y)}Fe_y)X$ (where $0 \leq y \leq 1$ and X is Si, Ge, Sn, Al, Ga, or a combination thereof), CoFeX (where X is Si, Ge, Sn, Al, Ga, or a combination thereof). The under-layer can include a layer of Ta, a Cu layer formed over the layer of Ta and deposited using a process gas comprising about 20 percent nitrogen and a layer of Ag deposited over the layer of Cu and deposited using a process gas comprising about 50 to 100 percent nitrogen.

9 Claims, 6 Drawing Sheets

(56) References Cited

U.S. PATENT DOCUMENTS

| | | | |
|---|---|---|---|
| 2005/0036244 A1* | 2/2005 | Carey et al. | 360/324.12 |
| 2007/0141401 A1 | 6/2007 | Maeda et al. | 428/831.2 |
| 2007/0165337 A1 | 7/2007 | Ide et al. | 360/324.2 |
| 2007/0297100 A1 | 12/2007 | Miyajima et al. | 360/324.11 |
| 2008/0232003 A1 | 9/2008 | Ibusuki et al. | 360/324.11 |
| 2009/0027813 A1 | 1/2009 | Carey et al. | 360/324.12 |

OTHER PUBLICATIONS

Hirota, E. et al., Giant Magneto-Resistance Devices, Springer publishers, 2001, p. 67-115.*

M. Takano et al., "Fabrication of Highly (100) Oriented $Co_2MnGe$ Thin Films and Magnetic Tunnel Junctions with $Co_2MnGe$ (100) Film on Non-single-crystal Substrate" Journal of the Magnetics Society of Japan, vol. 32 (2008), No. 1 pp. 12-16.

Soon Cheon Byeon et al., "High Moment Epitaxial Fe—N Thin Films" IEEE Transactions on Magnetics, vol. 37, No. 4, Jul. 2001.

Midori Kawamura et al., "Orientation of metal films deposited by sputtering using $Ar/N_2$ gas mixtures" www.elsevier.com/locate/tsf ; Sep. 11, 2004.

Midori Kawamura et al., "Sputter-deposition of Ag films in a nitrogen discharge" www.elsevier.com/locatetsf; Jan. 31, 2006.

Koji Ueda et al,, "Low Temperature Epitaxial Growth of Full Heusler Alloy $Fe_2MnSi$ on Ge(111) Substrates of Spintronics Application" ECS Transactions, The Electrochemical Society, 2008.

Satoru Yoshimura et al., "Effect of buffer layer and seedlayer materials on control of crystallographic orientation of $Co_2MnGe$ layer onto a thermally oxidized Si wafer" Journal of Magnetism and Magnetic Materials 310 (2007) 1978-1980 www.elsevier .com/locate/jmmm.

* cited by examiner

MAGNETORESISTIVE SENSOR EMPLOYING NITROGENATED CU/AG UNDER-LAYERS WITH (100) TEXTURED GROWTH AS TEMPLATES FOR COFE, COFEX, AND CO₂(MNFE)X ALLOYS

FIELD OF THE INVENTION

The present invention relates to magnetoresistive sensors and more particularly to a sensor having an under-layer that promotes a desired grain structure in above deposited sensor layers.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least a coil and first and second pole piece layers separated by a gap layer at an air bearing surface (ABS) of the write head. Current conducted through the coil induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs, a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for passing an electrical sense current through the sensor. Magnetic shields are positioned above and below the sensor stack and can also serve as first and second electrical leads, so that the electrical current travels perpendicularly to the plane of the free layer, spacer layer and pinned layer (current perpendicular to the plane (CPP) mode of operation). The magnetization direction of the pinned layer is pinned perpendicular to the air bearing surface (ABS) and the magnetization direction of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, scattering of the conduction electrons is minimized and when the magnetizations of the pinned and free layer are antiparallel, scattering is maximized. In a read mode the resistance of the spin valve sensor changes about linearly with the magnitudes of the magnetic fields from the rotating disk. When a sense current is conducted through the spin valve sensor, resistance changes cause potential changes that are detected and processed as playback signals.

In the push to increase data density and sensor performance, researchers have sought to develop magnetoresistive sensors having ever increased sensitivity and reduced size. Certain alloys have shown promise for increasing the performance of such magnetoresistive sensors. However, depositing such layers over available shield lead structure has resulted in less than optimal crystalline grain growth in these magnetic alloys. Thus what is needed is a spin-valve sensor structure that allows favorable alloys to be used with optimal crystalline grain structure and orientation.

SUMMARY OF THE INVENTION

The present invention provides a CPP magnetoresistive sensor that includes an under-layer structure that includes a first sub-layer, a second sub-layer comprising Cu formed over the first sub-layer and a third sub-layer comprising Ag formed over the second sub-layer, and a magnetic free layer structure formed over and in contact with the under-layer structure.

The second copper (Cu) and third silver (Ag) sub-layers are face-centered cubic and thus typically grow with a <111> texture. However, a strong <100> crystalline texture can be achieved by depositing the layers in an Argon (Ar) plus nitrogen ($N_2$) process gas mixture. The second sub-layer is deposited utilizing a process gas mixture that contains about 10-25 percent nitrogen (the balance of gas being Ar) and the third sub-layer is deposited utilizing a process gas mixture that contains about 50-100 percent nitrogen with the balance of gas being Ar.

The ferromagnetic free layer, formed over the under-layer structure is for example CoFe, a ferromagnetic Heusler alloy such as $Co_2(Mn_{(1-y)}Fe_y)X$ (where 0≤y≤1 and X is Si, Ge, Sn, Al, Ga, or a combination thereof), or ternary magnetic alloys CoFeX alloy (where X is Si, Ge, Sn, Al, Ga, or a combination thereof). These materials can provide excellent properties for increased magnetoresistive effect when used in a free layer of a magnetoresistive sensor. Since they are body-centered cubic they ordinarily grow with a <110> texture. However, by growing the free layer on top of an under-layer according to the invention, due to the good in-plane lattice matching to the third sub-layer of Ag the ferromagnetic free layer will also have a <100> texture. This texture is preferred to obtain high magneto-resistance values.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
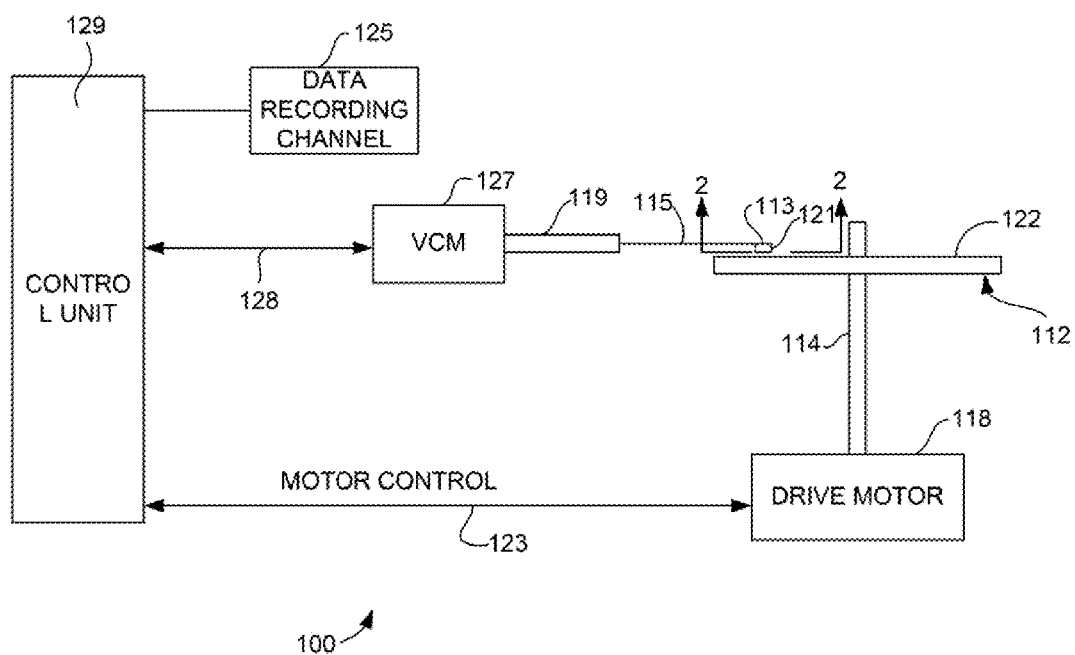
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
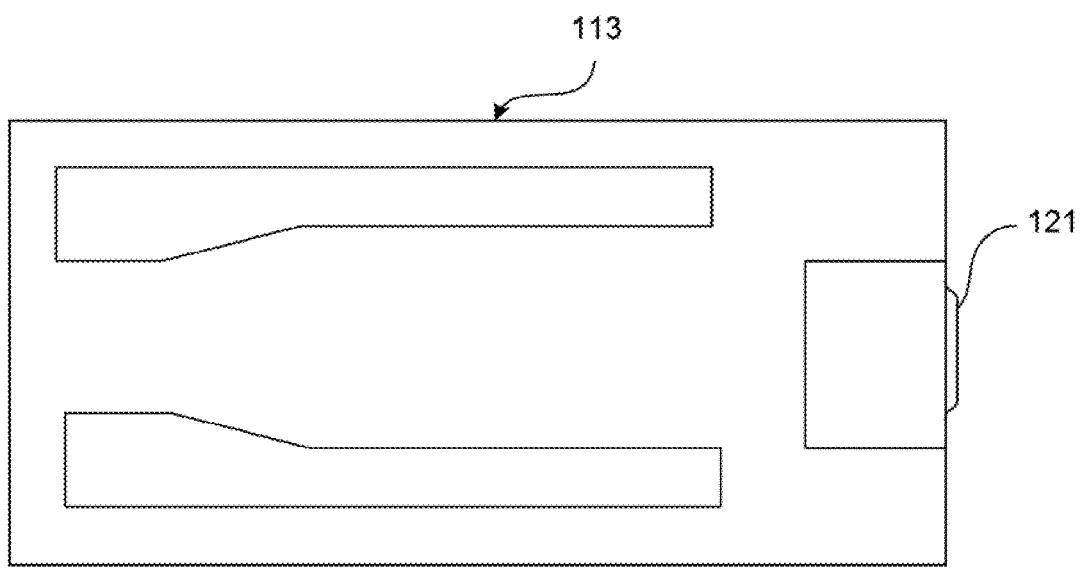
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
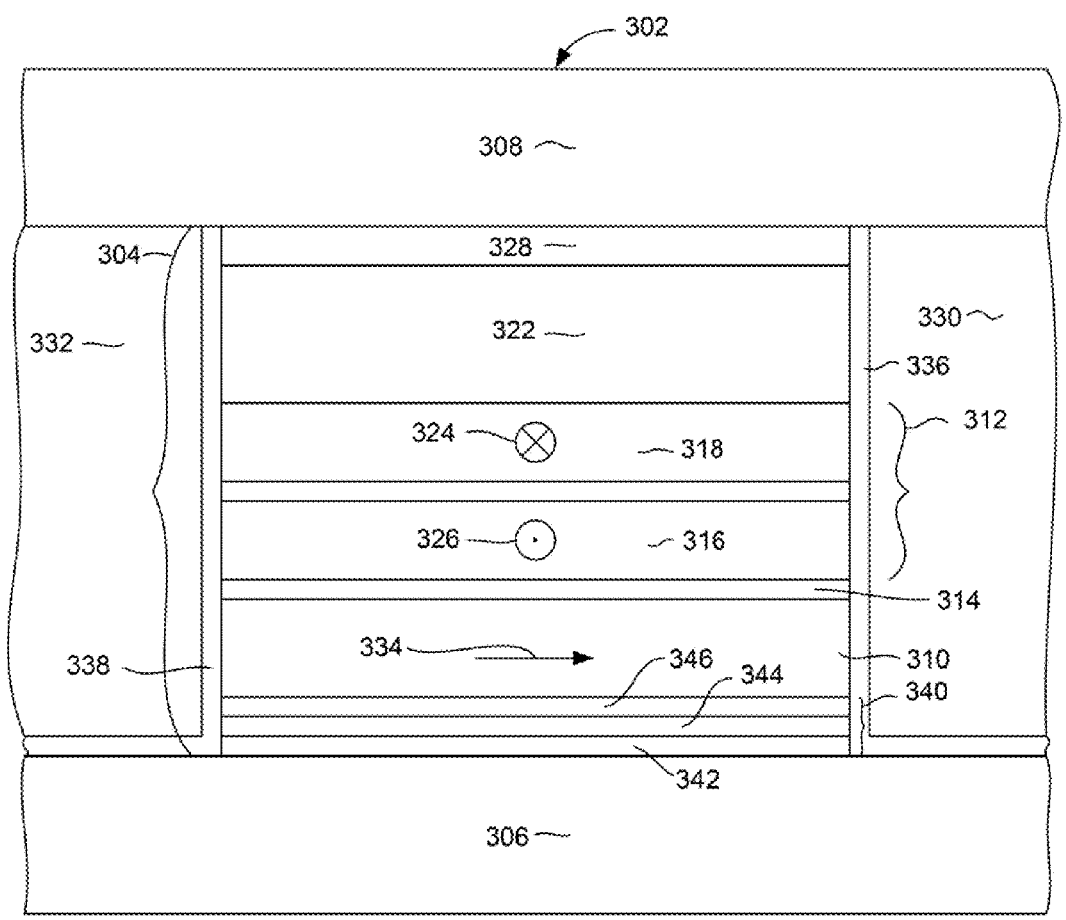
FIG. 3 is an enlarged ABS view of a magnetoresistive sensor of a magnetic head for use in disk drive system.

With reference now to FIG. 3, the invention can be embodied in a current-perpendicular to the plane (CPP) magnetoresistive sensor 302 such as a giant magnetoresistive sensor (GMR) or tunnel junction magnetoresistive sensor (TMR) that includes a sensor stack 304 sandwiched between first and second magnetic shields 306, 308 that can be constructed of an electrically conductive material such as NiFe that can serve as electrical leads as well as magnetic shields. The sensor stack 304 can be constructed to include a magnetic free layer 310, a pinned layer structure 312 and a non-magnetic layer 314 sandwiched between the free layer 310 and pinned layer structure 314. The non-magnetic layer 310 can be an electrically conductive, non-magnetic spacer layer such as Cu or Ag if the sensor 302 is constructed as a giant magnetoresistive sensor (GMR). Alternatively, the layer 314 can be a thin, electrically insulating, non-magnetic barrier layer such as MgO or $Al_2O_3$ if the sensor 302 is constructed as a tunnel junction magnetoresistive sensor (TMR).

The pinned layer structure 312 can be constructed as an antiparallel coupled structure having first and second magnetic layers AP2 316 (reference layer) and AP1 318 (pinned layer), both of which are antiparallel coupled with one another across a non-magnetic AP coupling layer 320 sandwiched there-between. The AP coupling layer 320 can be a material such as Ru, Cr, Ir, or Rh and typically is about 4-12 Angstroms thick, where the optimal thickness depends on the AP1, AP2 and AP coupling layer materials used. The AP1 layer 318 can be exchange coupled with a layer of antiferromagnetic material (AFM layer) 322. This exchange coupling strongly pins the magnetization of the AP1 layer 318 in a first direction substantially perpendicular the air bearing surface (ABS) as indicated by arrow tail symbol 324. Here and in the following, substantially perpendicular to the ABS has the meaning of closer to perpendicular than parallel to the ABS. Similarly, substantially parallel to the ABS has the meaning of closer to parallel than perpendicular to the ABS. The strong antiparallel coupling between the AP1 and AP2 layers 318, 316 pins the magnetization of the AP2 layer in a second direction (opposite to magnetization 324) as indicated by arrowhead symbol 326. A capping layer 328 can be provided at the top of the sensor stack 304 to protect the layers of the sensor stack from damage during manufacture.

First and second magnetic hard bias layers 330, 332 can be provided at either side of the sensor stack 304 to provide a magnetic bias field to bias the magnetization of the free layer 310 in a desired direction parallel with the ABS as indicated by arrow symbol 334. The first and second hard bias layers 330, 332 are insulated from the sensor stack 304 and from at least one of the shield/leads 306 by thin insulation layers 336, 338 in order to prevent sensor current from being shunted across through the bias layers 330, 332.

The electrical resistance across the sensor stack 304 varies depending upon the relative orientation of the magnetizations 334 and 326 of the free layer 310 and AP2 layer 316, respectively. The closer these magnetizations 334, 326 are to being parallel with one another the lower the resistance will be, and the closer they are to being antiparallel the higher the resistance will be. Because the magnetization 334 of the free layer 310 is free to move in response to an external magnetic field, this resulting change in electrical resistance across the sensor stack 332 can be measured to detect the presence and strength of a magnetic field.

Certain materials have the potential to provide excellent magnetoresistive properties when used in a free layer and/or reference layer, such as the free layer 310 and reference layer 316 of FIG. 3. These materials include highly spin-polarized ferromagnetic Heusler alloys such as $Co_2(Mn_{(1-y)}Fe_y)X$ (where $0 \leq y \leq 1$ and X is Si, Ge, Sn, Al, Ga, or a combination thereof), or CoFeX alloy (where X is Si, Ge, Sn, Al, Ga, or a combination thereof). It should be understood that here and in the following atomic compositions may vary slightly (to about 5 at. %) from the stoichiometric ratios in $Co_2(Mn_{(1-y)}Fe_y)X$ and CoFeX. These deviations are often found to be advantageous and desired to optimize parameters such as magnet-resistance and thermal phase stability. Thus, for example alloys like $Co_{49}(Mn_{0.5}Fe_{0.5})_{23}Ge_{28}$ and $Co_{34}Fe_{34}Ge_{28}$ are included in the groups of $Co_2(Mn_{(1-y)}Fe_y)X$ and CoFeX, respectively. These exhibit advantageous properties such as high spin-polarization or short spin-diffusion length to increase the magnetoresistive effect. Depending on their chemical order these alloys also are of $L2_1$, B2, or A2 type order. For example, fully ordered $Co_2MnX$ Heusler alloys are of $L2_1$ order. If there is disorder among the Mn and X atoms only, then the alloy is of B2 order, if it is disordered it is A2. Band structure calculations and magneto-transport experiments indicate that ferromagnetic $Co_2MnX$ type alloys need to be at least B2 ordered to exhibit high spin-polarization and thus yield high magnetoresistive values. Similarly CoFeX alloys are found to order in a B2-like structure that yields high magnetoresistive values. Both $Co_2(Mn_{(1-y)}Fe_y)X$ and CoFeX alloys are based on a body centered cubic cell and thus ordinarily grow with a <110> texture.

In order to increase the performance of the sensor 302, it is preferable that active layers of the magnetic sensor (the free layer 310 and/or reference layer 316) be constructed of an alloy such as those described above, but that they also be grown with a <100> crystalline texture rather than a <110> texture, to increase the magnetoresistive effect. The free layer 310 and reference layer 316 can also include a layer of CoFe, for example in between the seed layer structure and the $Co_2(Mn_{(1-y)}Fe_y)X$ or CoFeX layer to further improve texture of the $Co_2(Mn_{(1-y)}Fe_y)X$ or CoFeX layer and the spacer layer and to inhibit atomic diffusion upon annealing.

With reference still to FIG. 3, the free layer 310 is formed on top of an under-layer 340, which is preferably a multi-layer structure comprising a first sub-layer 342, and a second sub-layer 344 formed on top of the first sub-layer 342 and a third sub-layer 346 formed on top of the second sub-layer 344.

The first sub-layer 342 is for example 20-40 Å thick Ta or another metallic layer promoting adhesion and good crystallinity, the second sub-layer 344 comprises 50-80 Å Cu. The third sub-layer 346 comprises 30-60 Å Ag. Going forward, thinner under-layers may be advantageous in order to keep the magnetic shield-to-shield separation defining the magnetic read gap as small as possible since a decreasing read gap increases magnetic resolution and thus is desired for higher recording densities. Therefore, in such a case, the under-layers 340, 342, 344 can have a combined thickness of 80 Å or less. The second and third sub-layers 344 and 346 of under-layer 340 have a <100> texture that is a result of a unique deposition process that will be described below, the deposition process being compatible with the formation of a GMR sensor, without any extreme high temperature annealing that might otherwise damage the sensor.

Figure 4:
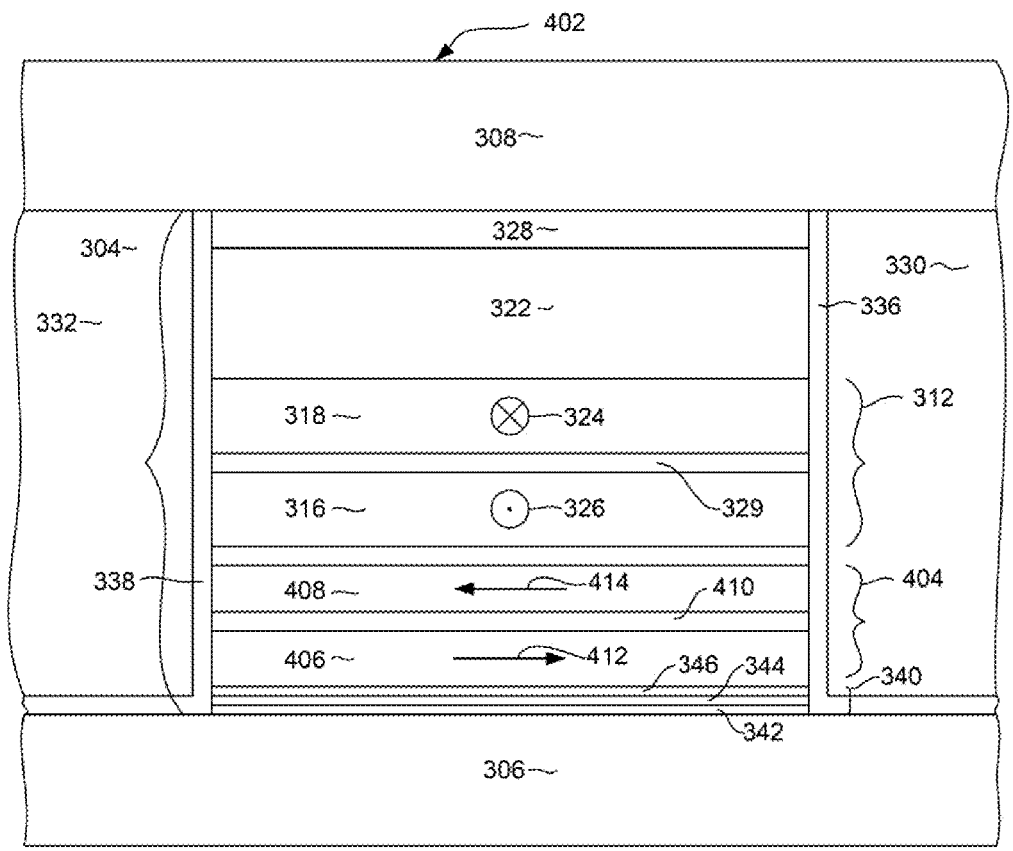
FIG. 4 is an enlarged ABS view of a magnetoresistive sensor according to an alternate embodiment of the invention.

FIG. 4 illustrates an alternate embodiment of the invention. FIG. 4 illustrates a magnetoresistive sensor 402 that is similar to that of FIG. 3, except that the sensor 402 includes an AP coupled or "synthetic" free layer 404. The synthetic free layer 404 includes first magnetic layer 408 (FL1) and second magnetic layer (FL2) 406 that are antiparallel coupled across a non-magnetic AP coupling layer 410 sandwiched there-between. The AP coupling layer 410 can be a material such as Ru, Cr, Ir, or Rh and is about 4-12 Angstroms thick, where the optimal thickness depends on the AP1, AP2 and AP coupling layer materials used. The antiparallel coupling of the layers 406, 408 causes the layers 406, 408 to have magnetizations that are biased in opposite directions substantially parallel with the ABS as indicated by arrow symbols 412, 414. In response to an external magnetic field, the magnetizations 412, 414 rotate, but remain substantially antiparallel with one another.

Magnetic free layers 406, 408 can both be constructed of a magnetic material such as a $Co_2(Mn_{(1-y)}Fe_y)X$ (where $0 \leq y \leq 1$ and X is Si, Ge, Sn, Al, Ga, or a combination thereof), a Heusler alloy or CoFeX (where X is Si, Ge, Sn, Al, Ga, or a combination thereof) as described in the previous embodiment. Alternatively, the first magnetic free layer 408 can be one of the above alloys and the second free magnetic layer 406 can be another type of magnetic material such as CoFe.

As with the previously described embodiment, the sensor 402 can include the under-layer 340, including sub-layers 342, 344, 346, where the layer 342 is for example a 20-30 Å thick layer of Ta or another metallic material promoting adhesion and good crystallinity, the layer 344 comprises 50-80 Å thick Cu and the layer 346 comprises 30-60 Å thick Ag. Also, as described above, the second and third sub-layers 344 and 346 of underlayer 340 have a desired <100> crystalline texture. Also, as before, this desired <100> crystalline texture is formed by a novel manufacturing process that will be described herein below.

The under-layer can be formed by a standard reactive thin film deposition process such as sputter deposition. A first sub-layer 342 such as Ta or another metallic layer promoting adhesion and good crystallinity is deposited on first lead and shield 306 (FIG. 3). Then second sub-layer 344 formed of Cu is deposited on first sub-layer 342 in an Ar—$N_2$ process gas. The amount of $N_2$ in the process gas is chosen to optimize <100> texture, for example 10-25 percent $N_2$ for magnetron sputtering. Then, the third sub-layer 346 formed from Ag is deposited on second sub-layer 344 in an Ar—$N_2$ process gas. Again, the amount of $N_2$ in the process gas is chosen to optimize <100> texture, for example 50-100 percent $N_2$ for sputtering. Ordinarily, Ag grows in a <111> texture. However, the inventors have found that when Ag is grown on Cu with a <100> texture utilizing a process gas described above, it grows with a desired <100> texture. Similarly, Cu has a face-centered cubic lattice. Ordinarily it grows in a <111> texture. However, when grown on Ta utilizing a process gas described above, it grows with a desired <100> texture. The Cu layer is important as a pre-seed layer for the Ag, which by itself would not grow in a <100> texture. Au grown in the <100> direction has a very good in-plane lattice match to $Co_2(Mn_{(1-y)}Fe_y)X$ and CoFeX alloys (where $0 \leq y \leq 1$ and X is Si, Ge, Sn, Al, Ga, or a combination thereof) and also to CoFe grown in the <100> direction since there is a close square root 2 relationship between the lattice constants of these materials and that of Ag. Ag has a face-centered cubic lattice.

Following the growth of under-layer 340, the free layer structure of spin-valve or tunnel valve as described in FIGS. 3 and 4 is grown. As described above, the free layer 310 or 404 grows with a desired <100> texture on underlayer 340 having a third sub-layer of Ag <100> texture.

Figure 5:
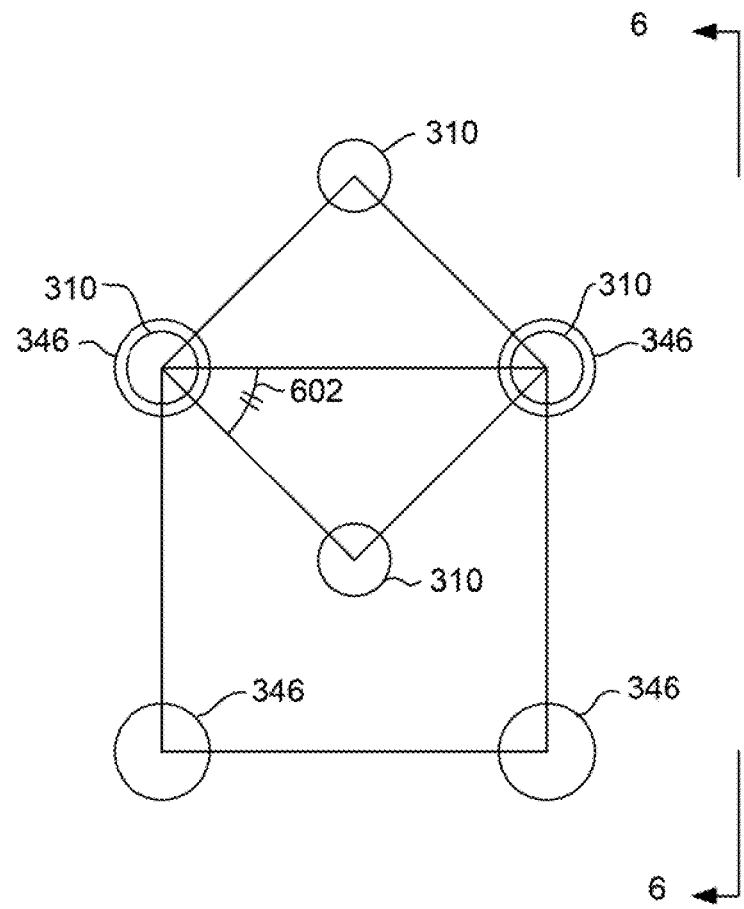
FIG. 5 is a top-down, atomic level view of a portion of an interface between an under-layer and a free layer of a magnetoresistive sensor according to an embodiment of the invention.
Figure 6:
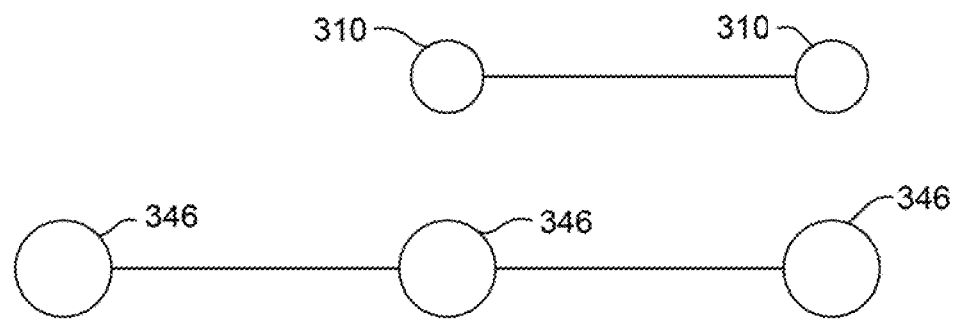
FIG. 6 is a side view, as viewed from line 6-6 of FIG. 5.

FIGS. 5 and 6 show an atomic level illustration of the interface and the close to square-root(2) relationship between the lattice spacings of the <100> Ag layer 346 and the <100> free layer 310. Due to the square-root(2) relationship the lattices are well matched when the lattice of the free layer 310 or 404 is rotated 45 degrees from the lattice of the underlying Ag layer 346. Although the free layer could be the free layer 310 of FIG. 3 or the free layer 404 of FIG. 4, for purposes of simplicity the free layer will be referred to as 310 in FIG. 5. FIG. 5 shows a top down view of atoms of the deposited layers 346 and 310, while FIG. 6 shows a side cross sectional view as viewed from line 6-6 of FIG. 5. As seen in FIG. 5, the relationship between the lattice sizes of layers 346 and 310 is such that the crystal lattice of the free layer 310 is rotated at an angle 602 of 45 degrees with respect to the lattice of the layer 346. While it is rotated 45 degrees, the layer 310 maintains the desired <100> texture.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor comprising:
    an under-layer comprising a first sub-layer comprising Ta, a second sub-layer comprising Cu and both having a (100) crystalline texture formed over the first sub-layer, and a third sub-layer comprising Ag and having a (100) crystalline texture formed over the second sub-layer; and
    a magnetic free layer structure formed over and in contact with the under-layer structure.

2. The magnetoresistive sensor as in claim 1 wherein the second has a thickness of 50-80 Å and third sub-layer has a thickness of 30-80 Å.

3. The magnetoresistive sensor as in claim 1 wherein the under-layer has a thickness that is 80 Angstroms or less.

4. The magnetoresistive sensor as in claim 1 wherein the free layer has a <100> crystalline texture.

5. The magnetoresistive sensor as in claim 1 wherein the free layer comprises a ferromagnetic Heusler alloy.

6. The magnetoresistive sensor as in claim 1 wherein the free layer comprises $Co_2(Mn_{(1-y)}Fe_y)X$ (where $0 \leq y \leq 1$ and X is Si, Ge, Sn, Ga, or a combination thereof), or CoFeX (where X is Si, Ge, Sn, Ga, or a combination thereof).

7. The magnetoresistive sensor as in claim 1 wherein the free layer comprises a layer of CoFe and a layer of $Co_2(Mn_{(1-y)}Fe_y)X$ (where $0 \leq y \leq 1$ and X is Si, Ge, Sn, Al, Ga, or a combination thereof), or a layer of CoFe and a layer of CoFeX (where X is Si, Ge, Sn, Al, Ga, or a combination thereof).

8. The magnetoresistive sensor as in claim 1 wherein the free layer comprises $Co_2(Mn_{(1-y)}Fe_y)X$ (where $0 \leq y \leq 1$ and X is Si, Ge, Sn, Al, Ga, or a combination thereof) with <100> texture, or CoFeX (where X is Si, Ge, Sn, Al, Ga, or a combination thereof) with <100> texture.

9. The magnetoresistive sensor as in claim 1 wherein the under-layer and the free layer are part of a sensor stack that is sandwiched between first and second electrically conductive leads arranged so that sense current flows in a direction that is substantially perpendicular to the plane of the under-layer and free layer.

\* \* \* \* \*